United States Patent
Li et al.

(10) Patent No.: US 11,632,879 B2
(45) Date of Patent: Apr. 18, 2023

(54) HEAT DISSIPATION PLATE FOR CHIP HEAT DISSIPATION, SERVER HEAT DISSIPATION SYSTEM, AND HEATING DEVICE

(71) Applicant: HANGZHOU DARERUOHAN TECHNOLOGY CO., LTD., Zhejiang (CN)

(72) Inventors: Risheng Li, Beijing (CN); Yunfeng Liu, Beijing (CN); Liedong Wang, Beijing (CN)

(73) Assignee: HANGZHOU DARERUOHAN TECHNOLOGY CO., LTD., Hangzhou (CN)

( * ) Notice: Subject to any disclaimer, the term of this patent is extended or adjusted under 35 U.S.C. 154(b) by 27 days.

(21) Appl. No.: 17/221,687

(22) Filed: Apr. 2, 2021

(65) Prior Publication Data
US 2021/0227724 A1  Jul. 22, 2021

Related U.S. Application Data

(63) Continuation of application No. PCT/CN2021/073165, filed on Jan. 21, 2021.

(30) Foreign Application Priority Data

Dec. 26, 2019  (CN) .......................... 201922386663.2

(51) Int. Cl.
  *H05K 7/20* (2006.01)
  *H01L 23/473* (2006.01)
(52) U.S. Cl.
  CPC ....... *H05K 7/20763* (2013.01); *H01L 23/473* (2013.01); *H05K 7/20272* (2013.01)
(58) Field of Classification Search
  CPC .............. H01L 23/473; H01L 23/4012; H05K 7/20927; H05K 7/20772; H05K 7/20272;
  (Continued)

(56) References Cited

U.S. PATENT DOCUMENTS 7,156,159 B2 *  1/2007  Lovette ................. H01L 23/473
                                                         257/E23.098
7,639,499 B1 * 12/2009  Campbell .......... H05K 7/20772
                                                         165/104.19
(Continued)

FOREIGN PATENT DOCUMENTS

CN        205119836 U       3/2016
CN        206639113 U      11/2017
CN        210805753 U       6/2020

OTHER PUBLICATIONS

International Search Report in PCT/CN2021/073165 dated Apr. 20, 2021, 10 Pages.
(Continued)

*Primary Examiner* — Adam B Dravininkas
(74) *Attorney, Agent, or Firm* — Metis IP LLC

(57) ABSTRACT

The present disclosure discloses a heat dissipation plate for chip heat dissipation, a server heat dissipation system, and a heating device. One end of the heat dissipation plate may be blocked. Another end of the heat dissipation plate may be provided with a water inlet and a water outlet. A pipeline assembly in the heat dissipation plate may include a plurality of branch water inlet pipelines and a plurality of branch outlet pipelines. One end of the plurality of branch water inlet pipelines may operably connect to the water inlet. One end of the plurality of branch water outlet pipelines may operably connect to the water outlet. Another end of the plurality of branch water inlet pipelines may be operably connected to another end of the plurality of branch water outlet pipelines through a connection pipeline.

8 Claims, 6 Drawing Sheets

(58) Field of Classification Search
CPC .......... H05K 7/20254; H05K 7/20781; H05K 7/20763
See application file for complete search history.

(56) References Cited

U.S. PATENT DOCUMENTS

| | | | | |
|---|---|---|---|---|
| 2002/0117291 | A1* | 8/2002 | Cheon | G06F 1/20 165/80.4 |
| 2004/0182548 | A1* | 9/2004 | Lovette | H01L 23/473 257/E23.098 |
| 2005/0230086 | A1 | 10/2005 | Wang et al. | |
| 2008/0111287 | A1* | 5/2008 | Pyne | F28D 15/02 266/190 |
| 2010/0290190 | A1* | 11/2010 | Chester | B65B 63/08 174/547 |
| 2012/0020004 | A1* | 1/2012 | Rau | H01L 23/473 361/679.31 |
| 2012/0125573 | A1* | 5/2012 | Rubenstein | F28D 20/02 165/104.33 |
| 2016/0043454 | A1* | 2/2016 | Shaaia | F28F 3/12 29/890.035 |
| 2017/0303431 | A1* | 10/2017 | Kim | H01L 23/147 |
| 2019/0045652 | A1* | 2/2019 | Hirano | H05K 7/1492 |

OTHER PUBLICATIONS

Written Opinion in PCT/CN2021/073165 dated Apr. 20, 2021, 10 Pages.

\* cited by examiner

400

HEAT DISSIPATION PLATE FOR CHIP HEAT DISSIPATION, SERVER HEAT DISSIPATION SYSTEM, AND HEATING DEVICE

CROSS-REFERENCE TO RELATED APPLICATION

This application is a Continuation of International Application No. PCT/CN2021/073165 filed on Jan. 21, 2021, which claims priority of Chinese Patent Application No. 201922386663.2 filed on Dec. 26, 2019, the contents of each of which are hereby incorporated by reference in their entirety.

TECHNICAL FIELD

The present disclosure relates to the technical field of energy recovery and reuse, and particularly relates to a heat dissipation plate for chip heat dissipation, a server heat dissipation system, and a heating device.

BACKGROUND

The statements in this section merely provide background information related to the present disclosure, and do not necessarily constitute prior art.

Currently, chips of a central processing unit\graphics processing unit (CPU\GPU), chips of an application specific integrated circuit (ASIC), board industries, large computing power servers, 5G data exchange devices, 4G or 5G radio frequency terminal devices, and virtual currency service devices have a large number of applications. A large number of chips and boards work together. During working time of used high-speed chips, a lot of heat may be produced. In order to ensure a normal operation of the chip, the chip must be cooled.

The existing manner of heat dissipation usually uses air cooling or water cooling. The air cooling uses a heat dissipation fan with a high volume to accelerate a flow of air, and then take away the heat. The fan may also consume more electricity during the working time. Simultaneously, high-decibel noise may be generated, which may cause an ambient temperature to heat up. Water cooling usually uses a small-hole water-cooling plate. As shown in FIG. 1, the water-cooling plate 100 includes a water inlet 101, a water outlet 102, and an internal serpentine pipeline 103. Water enters the pipeline 103 through the water inlet 101 and reaches the water outlet 102 back and forth many times through the pipeline 103. A resistance of the water flow is large, an efficiency of the heat dissipation is low, and the heat is directly released to the environment where the water-cooling plate 100 is located. Therefore, an increase in the ambient temperature may be caused. In order to reduce the ambient temperature as a whole, large-scale air-conditioning compressors and other devices may be used again to cool down twice, which increases operating costs and energy consumption.

SUMMARY

In order to overcome the above shortcomings, the present disclosure provides a heat dissipation plate for chip heat dissipation and a server heat dissipation system through which heat generated in an operation of a board or chip may be taken away in time. In this way, a temperature of the chip may be effectively reduced to ensure a safe operation of the chip.

In order to achieve the above purpose, one or more embodiments of the present disclosure provide the following technical solutions.

One or more embodiments of the present disclosure provide a heat dissipation plate for chip heat dissipation. One end of the heat dissipation plate may be blocked, and another end of the heat dissipation plate may be provided with a water inlet and a water outlet. A pipeline assembly in the heat dissipation plate may include a plurality of branch water inlet pipelines and a plurality of branch water outlet pipelines. One end of the plurality of branch water inlet pipelines may operably connect to the water inlet. One end of the plurality of branch water outlet pipelines may operably connect to the water outlet. Another end of the plurality of branch water inlet pipelines may operably connect to another end of the plurality of branch water outlet pipelines through a connection pipeline.

In some embodiments, the plurality of branch water inlet pipelines and the plurality of branch water outlet pipelines may be parallel to each other.

In some embodiments, a pore diameter of the plurality of branch water inlet pipelines and a pore diameter of the plurality of branch water outlet pipelines may be the same.

In some embodiments, distances between any two adjacent pipelines of the plurality of branch water inlet pipelines and the plurality of branch water outlet pipelines may be equal.

In some embodiments, the plurality of branch water inlet pipelines and the plurality of branch water outlet pipelines may be parallel to a long side of the heat dissipation plate. The connection pipeline may be parallel to a short side of the heat dissipation plate.

In some embodiments, a fluid heat carrier used in the heat dissipation plate may include water, an antifreeze, a phase-change material, or the like, or any combination thereof.

One or more embodiments of the present disclosure provide a server heat dissipation system including one or more heat dissipation plates. The server heat dissipation system may include one or more board module heat dissipation units. For each of the one or more board module heat dissipation units, the board module heat dissipation unit may include a plurality of boards. One of the one or more heat dissipation plates may be installed between each two adjacent boards of the plurality of boards of the board module heat dissipation unit. The two adjacent boards may be attached to two surfaces of the heat dissipation plate, respectively. A position of the heat dissipation plate may correspond to a position of one or more chips on the two adjacent boards.

In some embodiments, the server heat dissipation system may further include a layered cabinet including a plurality of layers, a water inlet pipe, a water separator pipeline, a water collector pipeline, and a water outlet pipe. Each of the plurality of layers of the layered cabinet may be provided with a plurality of board module heat dissipation units. The water inlet pipe may be operably connected to the water separator pipeline. The water separator pipeline may be operably connected to the water inlet of each of the heat dissipation plates of the plurality of board module heat dissipation units. The water outlet of each of the heat dissipation plates of the plurality of board module heat dissipation units may be operably connected to the water collector pipeline. The water collector pipeline may be operably connected to the water outlet pipe.

In some embodiments, two or more adjacent heat dissipation plates may be used as a group. The water inlet on one end of a first heat dissipation plate of the two or more adjacent heat dissipation plates may be operably connected with the water separator pipeline. The water outlet of the first heat dissipation plate may be operably connected with a water inlet of a second heat dissipation plate of the two or more adjacent heat dissipation plates in the group, and so on. The second heat dissipation plate may be adjacent to the first heat dissipation plate. A water outlet of a last heat dissipation plate of the two or more adjacent heat dissipation plates may be operably connected to the water collector pipeline.

In some embodiments, the water inlet and the water outlet of each heat dissipation plate may be disposed at the same side of the heat dissipation plate. Each two adjacent layers of the plurality of layers of the layered cabinet may be provided with a water separator pipeline and a water collector pipeline to dissipate heat for the heat dissipation plates located on the upper layer of the two adjacent layers and the lower layer of the two adjacent layers.

One or more embodiments of the present disclosure provide a heating device. The heating device may be operably connected to the server heat dissipation system. One or more of the above technical solutions may have the following beneficial effects.

A plurality of branch water inlet pipelines and a plurality of branch water outlet pipelines may be arranged in parallel in the heat dissipation plate of the present disclosure. The plurality of branch water inlet pipelines and the plurality of branch water outlet pipelines may be evenly distributed in the heat dissipation plate. Therefore, a path of the fluid heat carrier from the water inlet to the water outlet of the heat dissipation plate may be short, so that the fluid heat carrier may quickly spread across the entire heat dissipation plate, which may improve the heat dissipation efficiency of the heat dissipation plate and the heat dissipation effect of the heat dissipation plate. Hence, the heat dissipation plate may be used to replace traditional fans to reduce noise and energy consumption.

In some embodiments, the pore diameters of the plurality of branch water inlet pipelines and the plurality of branch water outlet pipelines may be as large as possible. In some embodiments, the number (or count) of the plurality of branch water inlet pipelines and the plurality of branch water outlet pipelines may be as large as possible. For example, a pipeline assembly including a plurality of pipelines that are with a large pore diameter and densely distributed may be adopted. Therefore, a resistance of the fluid heat carrier in the heat dissipation plate may be small, the heat dissipation of the heat dissipation plate may be fast, materials used to make the heat dissipation plate may be less, and manufacturing costs of the heat dissipation plate may be reduced. Moreover, due to the low resistance of the fluid heat carrier in the heat dissipation plate, a good effect of heat dissipation may also be achieved using an antifreeze liquid with poor fluidity in the heat dissipation plate, which makes the heat dissipation plate be better adapted in an outdoor environment in the north with an ultra-low temperature.

The heat dissipation plate in the present disclosure may be used for heat dissipation of boards and/or chips. By installing the boards and the heat dissipation plates alternately, heat generated during an operation of the boards or chips may be taken away in time. A temperature of the boards and/or the chips may be effectively reduced to ensure a safe operation of the boards and/or the chips.

The present disclosure may be applied to energy saving, silent heat dissipation, and heat recovery of various chips and boards. The recovered heat may be re-applied to heating, drying, heat preservation, chemical preheating, and other industries that require heating.

One or more embodiments of the present disclosure also provide a heating device. The heating device may effectively utilize heat of the fluid heat carrier flowing out from the water outlet pipe of the server heating dissipation system. The heating device may be operably connected to the server heating dissipation system, which may save costs for customers who need heat dissipation and/or heat supply.

The present disclosure may be applied to on-site heat dissipation and/or heat collection of a variety of boards and chips, etc. The present disclosure may be suitable for a variety of on-site heating requirements, pollution-free and emission-free sites, low-noise heating sites, electricity-to-coal heating sites, and other places that need heating (e.g., individuals, families, schools, hospitals, swimming pools, Chinese herbal medicine factories, food factories, office buildings, residential buildings, stations, airports, etc.).

BRIEF DESCRIPTION OF THE DRAWINGS

The accompanying drawings that form a portion of the present disclosure are used to provide a further understanding of the present disclosure. The exemplary embodiments and descriptions of the present disclosure are used to explain the present disclosure, and do not constitute an improper limitation of the present disclosure.

DETAILED DESCRIPTION

It should be pointed out that the following detailed descriptions are all exemplary and are intended to provide further descriptions of the present disclosure. Unless otherwise specified, all technical and scientific terms used herein have the same meaning as commonly understood by those skilled in the art in the technical field to which the present disclosure belongs.

It should be noted that the terms used herein are merely for describing specific embodiments, and are not intended to limit the exemplary embodiments according to the present disclosure. As used herein, unless the context clearly illustrates otherwise, the singular form is also intended to include plural referents. In addition, it should also be understood that when the terms "comprise" and/or "include" are used in the present disclosure, the terms indicate that there are features, steps, operations, devices, components, and/or combinations thereof.

In the case of no conflict, the embodiments and the features in the embodiments of the present disclosure may be combined with each other.

Embodiment One

Figure 1:
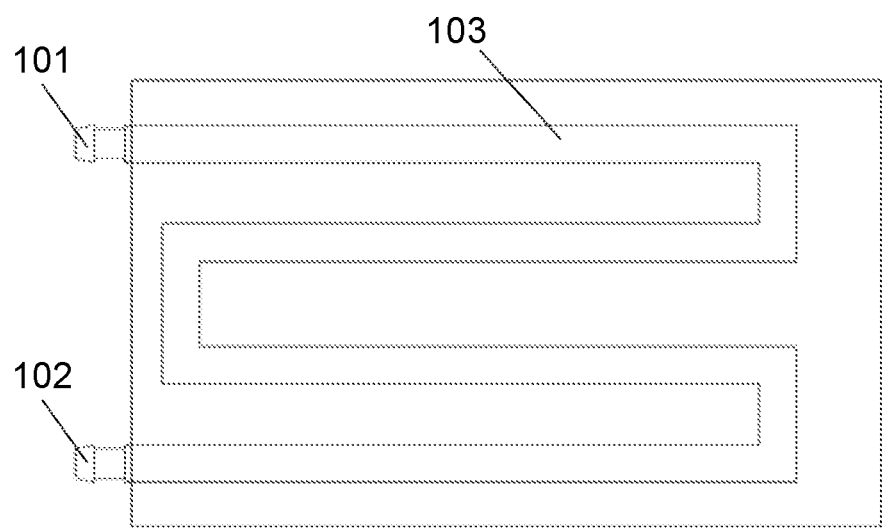
FIG. 1 is a schematic diagram illustrating a structure of a water-cooling heat dissipation plate.
Figure 2:
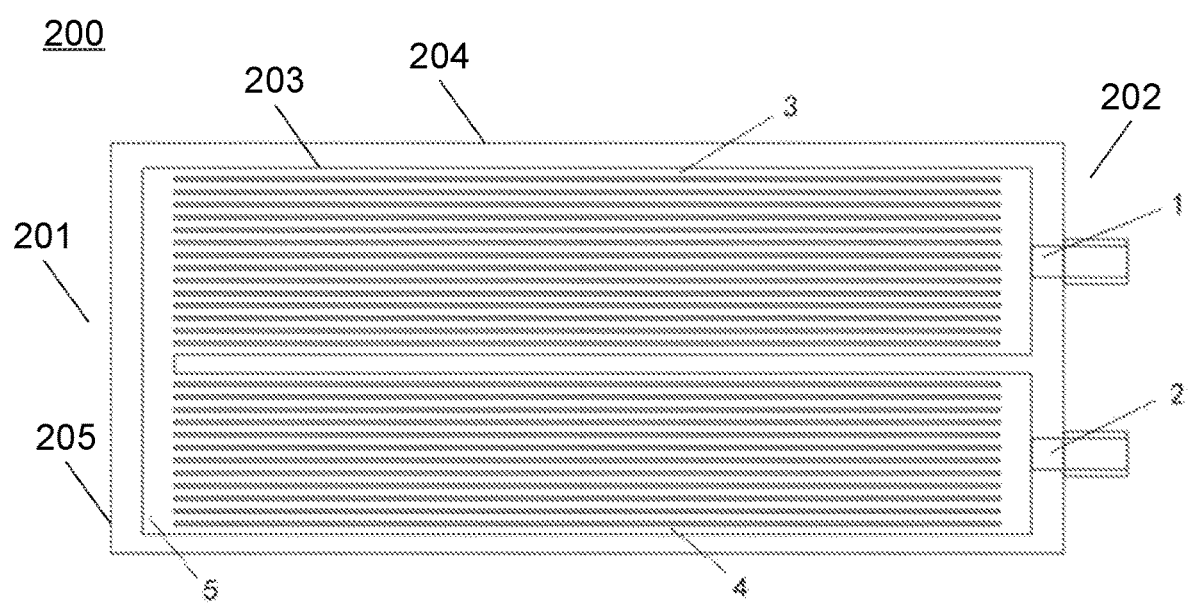
FIG. 2 is a schematic diagram illustrating a structure of fluid flow channels in an exemplary heat dissipation plate according to some embodiments of the present disclosure.

The embodiment discloses a heat dissipation plate 200 for chip heat dissipation. FIG. 2 is a schematic diagram illustrating a structure of fluid flow channels in the exemplary heat dissipation plate 200 according to some embodiments of the present disclosure. As shown in FIG. 2, one end 201 of the heat dissipation plate 200 may be blocked. Another end 202 of the heat dissipation plate 200 may be provided with a water inlet 1 and a water outlet 2. The end 201 may be opposite to the end 202. A pipeline assembly 203 in the heat dissipation plate 200 may include a connection pipeline 5 arranged at the blocked end 201 of the heat dissipation plate 200, a plurality of branch water inlet pipelines 3 two ends of which operably connect to the water inlet 1 and the connection pipeline 5, respectively, and a plurality of branch water outlet pipelines 4 two ends of which operably connect to the water outlet 2 and the connection pipeline 5, respectively. In some embodiments, as shown in FIG. 2, the plurality of branch water inlet pipelines 3 and the plurality of branch water outlet pipelines 4 may be parallel to each other.

Figure 3:
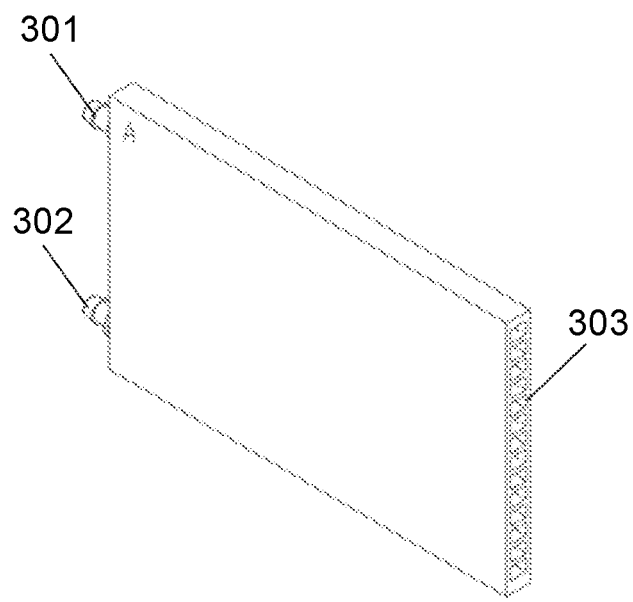
FIG. 3 is a schematic diagram illustrating a cross-section of an exemplary heat dissipation plate according to some embodiments of the present disclosure.

In some embodiments, the plurality of branch water inlet pipelines 3 and the plurality of branch water outlet pipelines 4 may be evenly distributed in the heat dissipation plate 200. For example, as shown in FIG. 2, distances between any two adjacent pipelines of the plurality of branch water inlet pipelines 3 and distances between any two adjacent pipelines of the plurality of branch water outlet pipelines 4 may be equal. As another example, as shown in FIG. 3, distances between any two adjacent pipelines of the plurality of branch water inlet pipelines 3 and the plurality of branch water outlet pipelines 4 may be equal. FIG. 3 is a schematic diagram illustrating a cross-section of an exemplary heat dissipation plate 300 according to some embodiments of the present disclosure. In some embodiments, the heat dissipation plate 200 may be implemented based on the heat dissipation plate 300. As shown in FIG. 3, the heat dissipation plate 300 may include a water inlet 301, a water outlet 302, and a pipeline assembly 303 that is a honeycomb pipeline structure. The honeycomb pipeline structure may include a plurality of branch water inlet pipelines and a plurality of branch water outlet pipelines that are densely distributed and with large pore diameters.

In some embodiments, the pore diameters of the plurality of branch water inlet pipelines and the plurality of branch water outlet pipelines may be the same. In some embodiments, distances between any two adjacent pipelines of the plurality of branch water inlet pipelines and the plurality of branch water outlet pipelines may be equal. In some embodiments, within an allowable range of a size of the heat dissipation plate and a strength of a pipeline wall of the heat dissipation plate, the pore diameter may be as large as possible, and/or a number (or count) of the plurality of branch water inlet pipelines and the plurality of branch water outlet pipelines may be as large as possible.

Back to FIG. 2, in some embodiments, a flow heat carrier may enter through the water inlet 1. Then, the flow heat carrier may flow into the heat dissipation plate 200 via the plurality of branch water inlet pipelines 3. The flow heat carrier may flow together at the connection pipeline 5. Subsequently, the flow heat carrier may flow out from the water outlet 2 via the plurality of branch water outlet pipelines 4. Therefore, a purpose of heat dissipation may be achieved. Compared with a snakelike pipe, a path of the flow heat carrier from the water inlet 1 to the water outlet 2 of the heat dissipation plate 200 in the present disclosure may be shorter, so that the flow heat carrier may be quickly spread within the heat dissipation plate 200, which may improve the efficiency of heat dissipation and the heat dissipation effect of the heat dissipation plate 200.

In some embodiments, the plurality of branch water inlet pipelines 3 and the plurality of branch water outlet pipelines 4 may be parallel to a long side 204 of the heat dissipation plate 200. The connection pipeline 5 may be parallel to a short side 205 of the heat dissipation plate 200. In some embodiments, the long side 204 may be adjacent to the short side 205. In some embodiments, the long side 204 may be vertical to the short side 205. In some embodiments, the pore diameter of the plurality of branch water inlet pipelines and the plurality of branch water outlet pipelines may be as large as possible, and/or the distances between any two adjacent pipelines of the plurality of branch water inlet pipelines and the plurality of branch water outlet pipelines may be as short as possible. For example, as shown in FIG. 3, the plurality of branch water inlet pipelines and the plurality of branch water outlet pipelines may be evenly distributed in the heat dissipation plate 300. By adopting a pipeline assembly 203 with a plurality of pipelines that are densely distributed and with large pores, a resistance of the flow heat carrier in the heat dissipation plate 200 may be small, the heat dissipation of the heat dissipation plate 200 may be fast, materials used to make the heat dissipation plate 200 may be less, and manufacturing costs of the heat dissipation plate 200 may be reduced.

In some embodiments, the heat dissipation plate 200 may be made of copper and/or aluminum heat conductor, which may improve the heat transmission effect and the heat dissipation effect of the heat dissipation plate 200, and improve a reliability of the heat dissipation of the heat dissipation plate 200.

In some embodiments, the flow heat carrier may include at least one of water, an antifreeze, a phase-change material, etc.

In some embodiments, the heat dissipation plate 200 may be directly formed by a mold drawing process. Both ends (e.g., 201 and 202) of the heat dissipation plate 200 may be sealed by welding. Therefore, production efficiency of the heat dissipation plate 200 may be effectively improved and production costs of the heat dissipation plate 200 may be reduced. A use of abrasive tools may ensure a surface accuracy and one-time molding of the heat dissipation plate 200, which may reduce costs of processing the heat dissipation plate 200.

Embodiment Two

The embodiment provides a server heat dissipation system based on the heat dissipation plate 200 described in embodiment one.

In some embodiments, the server heat dissipation system may include one or more board module heat dissipation units. For each of the one or more board module heat dissipation units, the board module heat dissipation unit may include one or more board modules. A board module may include a plurality of boards each of which may include one or more chips. A heat dissipation plate (e.g., the heat dissipation plate 200) may be installed between each two adjacent boards of the plurality of boards of the board module. In some embodiments, the two adjacent boards may be attached to two surfaces of the heat dissipation plate 200, respectively. In some embodiments, a position of the heat dissipation plate may correspond to a position of the one or more chips on the two adjacent boards.

Figure 4:
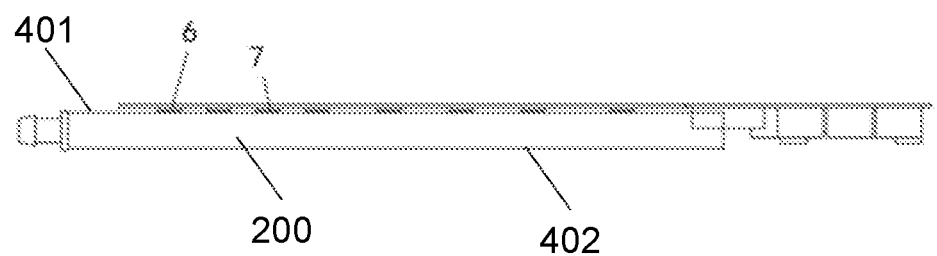
FIG. 4 is a schematic diagram illustrating an exemplary configuration of a connection between a heat dissipation plate and a board according to some embodiments of the present disclosure.

For example, FIG. 4 is a schematic diagram illustrating an exemplary configuration 400 of a connection between a heat dissipation plate and a board according to some embodiments of the present disclosure. As shown in FIG. 4, a board 6 may include one or more chips 7. A heat dissipation plate (e.g., the heat dissipation plate 200) may be installed between the board 6 and a board (not shown in FIG. 4) adjacent to the board 6. The board 6 may be attached to the surface 401 of the heat dissipation plate 200. Specifically, the one or more chips 7 on the board 6 may be attached to the surface 401 of the heat dissipation plate 200. The board adjacent to the board 6 may be attached to the surface 402 of the heat dissipation plate 200. The surface 402 may be located opposite to the surface 401. Specifically, the one or more chips on the adjacent board may be attached to the surface 402 of the heat dissipation plate 200. A position of the heat dissipation plate 200 may correspond to a position of the chips on the board 6 and the board adjacent to the board 6.

Figure 5:
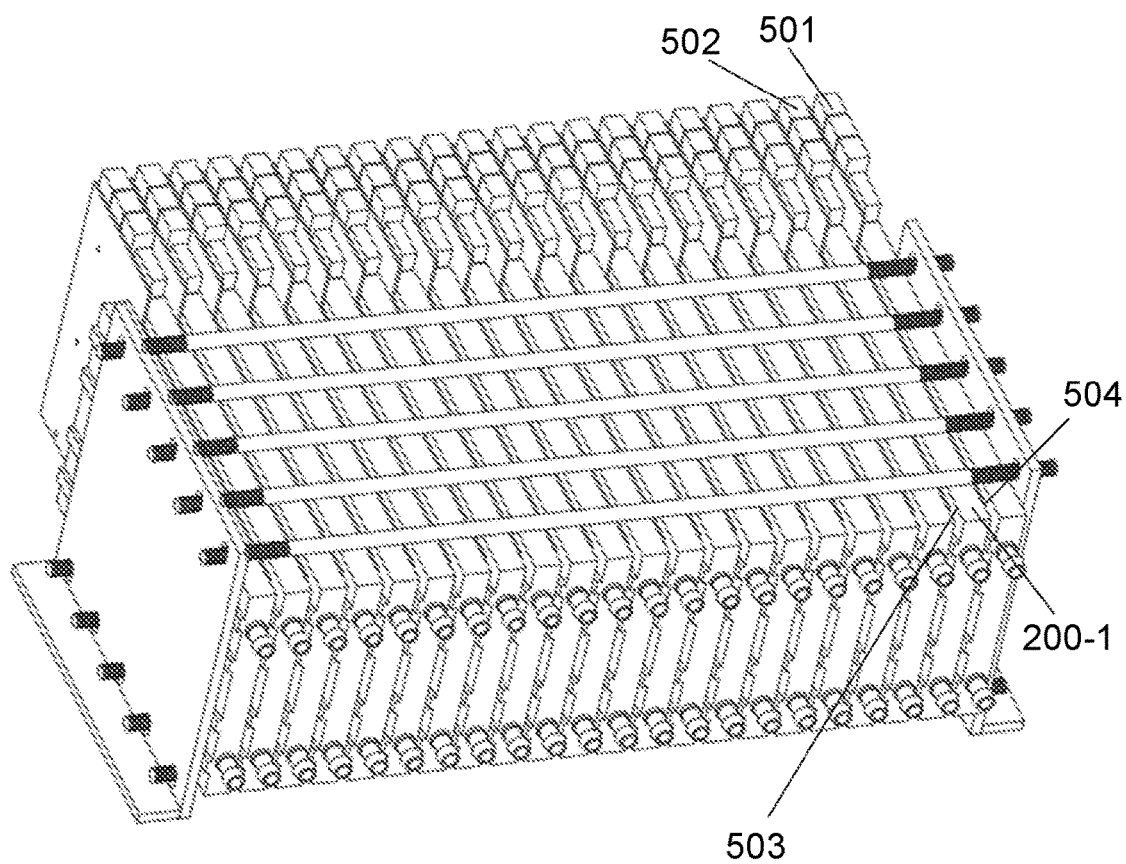
FIG. 5 is a schematic diagram illustrating heat dissipation boards in an exemplary board module according to some embodiments of the present disclosure.

As another example, FIG. 5 is a schematic diagram illustrating heat dissipation boards in an exemplary board module 500 according to some embodiments of the present disclosure. As shown in FIG. 5, the board module 500 may include a plurality of boards (e.g., 501, 502, etc.) each of which may include one or more chips. A heat dissipation plate may be installed between each two adjacent boards of the plurality of boards of the board module 500. For example, the heat dissipation plate 200-1 same as the heat dissipation plate 200 may be disposed between the board 501 and the board 502 of the board module 500. The board 501 may be attached to the surface 504 of the heat dissipation plate 200-1. Specifically, the one or more chips on the board 501 may be attached to the surface 504 of the heat dissipation plate 200-1. The board 502 may be attached to the surface 503 of the heat dissipation plate 200-1. Specifically, the one or more chips on the board 502 may be attached to the surface 503 of the heat dissipation plate 200-1. A position of the heat dissipation plate 200-1 may correspond to a position of the one or more chips on the boards 501 and 502.

In some embodiments, the server heat dissipation system may further include a water inlet pipe, a water separator pipeline, a water collector pipeline, and a water outlet pipe. In some embodiments, the water inlet pipe may be operably connected to the water separator pipeline. The water separator pipeline may be operably connected to the water inlet of each of the one or more heat dissipation plates in the heat dissipation system through one or more hoses. The water outlet of each of the one or more heat dissipation plates in the heat dissipation system may be operably connected to the water collector pipeline through one or more hoses. The water collector pipeline may be operably connected to the water outlet pipe.

In some embodiments, the flow heat carrier may enter the server heat dissipation system from the water inlet pipeline and flow out from the water outlet pipe.

In some embodiments, the heat dissipation plate may be closely attached to the chips of the two adjacent boards, so that the heat produced by the chips may be taken away by water and/or other fluids flowing in the heat dissipation plate to ensure that the chips may not work over temperature. In some embodiments, an installation manner that a board and a heat dissipation plate are installed alternately and in parallel may reduce fixing accessories such as screws, which may reduce installation time of the server heat dissipation system.

Embodiment Three

Figure 6:
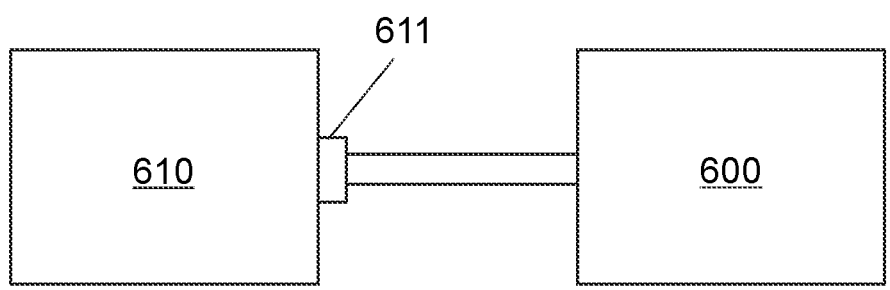
FIG. 6 is a schematic diagram illustrating an exemplary heating device according to some embodiments of the present disclosure.

The embodiment provides a heating device 600 as shown in FIG. 6.

The heating device 600 may use the heat of the flow heat carrier flowing from the water outlet pipe 611 of the server heat dissipation system 610 by performing a heat exchange between the flow heat carrier and the heating device 600 to make the flow heat carrier transmit heat to the heating device 600. In some embodiments, a water outlet pipe 611 of the server heat dissipation system 610 may be operably connected to the heating device 600.

One or more of the above embodiments may have the following beneficial effects.

A plurality of branch water inlet pipelines and a plurality of branch water outlet pipelines may be arranged in parallel in the heat dissipation plate of the present disclosure. The plurality of branch water inlet pipelines and a plurality of branch water outlet pipelines may be evenly distributed in the heat dissipation plate. Therefore, a path of the flow heat carrier from the water inlet to the water outlet of the heat dissipation plate may be short, and the flow heat carrier may quickly spread across the entire heat dissipation plate. In this way, the heat dissipation efficiency and the heat dissipation effect of the heat dissipation plate may be improved. Hence, the heat dissipation plate may be used to replace traditional fans to reduce noise and energy consumption.

In some embodiments, the pore diameters of the plurality of branch water inlet pipelines and the plurality of branch water outlet pipelines may be as large as possible. In some embodiments, the number (or count) of the plurality of branch water inlet pipelines and the plurality of branch water outlet pipelines may be as large as possible. For example, a pipeline assembly including a plurality of pipelines that are with a large pore diameter and densely distributed may be adopted in the heat dissipation plate. Therefore, a resistance of the fluid heat carrier in the heat dissipation plate may be small, the heat dissipation of the heat dissipation plate may be fast, materials used to make the heat dissipation plate may be less, and manufacturing costs of the heat dissipation plate may be reduced.

The heat dissipation plate in the present disclosure may be used for heat dissipation of boards and/or chips. By installing the boards and the heat dissipation plates alternately, heat generated during an operation of the boards and/or chips may be taken away in time. In this way, a temperature of the boards and/or the chips may be effectively reduced to ensure a safe operation of the boards and/or the chips.

The present disclosure may be applied to energy saving, silent heat dissipation, and heat recovery of various chips and boards. The recovered heat may be re-applied to heating, drying, heat preservation, chemical preheating, and other industries that require heating.

The above descriptions are merely the preferred embodiments of the present disclosure and are not used to limit the scope of the present disclosure. For the skilled in the art, the present disclosure may be subject to various modifications and variations. Within the spirit and principle of the present disclosure, any modification, equivalent replacement, improvement, etc. should be included in the protection scope of the present disclosure.

Although the above description of the specific implementation of the present disclosure is carried out in conjunction with the accompanying drawings, it does not limit the protection scope of the present disclosure. It should understand that on the basis of the technical solution of the present disclosure, various modifications or deformations that can be made without creative work by those skilled in the art are still within the protection scope of the present utility disclosure.

What is claimed is:

1. A heat dissipation plate for chip heat dissipation, comprising a water inlet, a water outlet, and a pipeline assembly, wherein
 a first end of the heat dissipation plate is blocked, and the water inlet and the water outlet are disposed at a second end of the heat dissipation plate;
 the pipeline assembly includes a plurality of branch water inlet pipelines and a plurality of branch water outlet pipelines, one end of the plurality of branch water inlet pipelines operably connecting to the water inlet, one end of the plurality of branch water outlet pipelines operably connecting to the water outlet, another end of the plurality of branch water inlet pipelines operably connecting to another end of the plurality of branch water outlet pipelines through a connection pipeline; and
 a flow heat carrier enters the heat dissipation plate through the water inlet, and is distributed into the plurality of branch water inlet pipelines, then, the flow heat carrier flows together at the connection pipeline, and subsequently is distributed into the plurality of branch water outlet pipelines to flow out from the water outlet.

2. The heat dissipation plate for chip heat dissipation of claim 1, wherein a pore diameter of the plurality of branch water inlet pipelines and a pore diameter of the plurality of branch water outlet pipelines are the same.

3. The heat dissipation plate for chip heat dissipation of claim 1, wherein the plurality of branch water inlet pipelines and the plurality of branch water outlet pipelines are parallel to a long side of the heat dissipation plate, and the connection pipeline is parallel to a short side of the heat dissipation plate.

4. The heat dissipation plate for chip heat dissipation of claim 1, wherein the flow heat carrier used in the heat dissipation plate includes at least one of water, an antifreeze, or a phase-change material.

5. A server heat dissipation system, including the heat dissipation plate of claim 1 and one or more board module heat dissipation units, wherein
 one of the one or more board module heat dissipation units includes a plurality of boards;
 the heat dissipation plate is disposed between two adjacent boards of the plurality of boards;
 the two adjacent boards are attached to two surfaces of the heat dissipation plate, respectively; and
 a position of the heat dissipation plate corresponds to a position of one or more chips on the two adjacent boards.

6. A heating device, wherein the heating device is operably connected to the server heat dissipation system of claim 5.

7. The heat dissipation plate for chip heat dissipation of claim 1, wherein the plurality of branch water inlet pipelines and the plurality of branch water outlet pipelines are parallel to each other.

8. The heat dissipation plate for chip heat dissipation of claim 1, wherein distances between any two adjacent pipelines of the plurality of branch water inlet pipelines and distances between any two adjacent pipelines of the plurality of branch water outlet pipelines are equal.

* * * * *